United States Patent [19]
Redline et al.

[11] Patent Number: 6,120,639
[45] Date of Patent: *Sep. 19, 2000

[54] METHOD FOR THE MANUFACTURE OF PRINTED CIRCUIT BOARDS

[75] Inventors: Ronald Redline, Prospect; Lucia Justice; Lev Taytsas, both of Waterbury, all of Conn.

[73] Assignee: MacDermid, Incorporated, Waterbury, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/972,213

[22] Filed: Nov. 17, 1997

[51] Int. Cl.⁷ ........................................................ B05D 5/12
[52] U.S. Cl. ............................ 156/325; 156/326; 427/98; 427/304; 427/437
[58] Field of Search ..................................... 427/98, 126.1, 427/437, 438, 443.1, 304; 156/151, 306.6, 306.9, 307.3, 307.7, 308.6, 314, 325, 326

[56] References Cited

U.S. PATENT DOCUMENTS

| | | |
|---|---|---|
| 4,409,037 | 10/1983 | Landau . |
| 4,642,161 | 2/1987 | Akahoshi . |
| 4,775,444 | 10/1988 | Cordani . |
| 4,786,528 | 11/1988 | Ameilo et al. ................... 156/306.9 X |
| 4,844,981 | 7/1989 | Landau . |
| 4,902,551 | 2/1990 | Nakaso . |
| 4,913,768 | 4/1990 | Wolf et al. ............................ 427/98 X |
| 4,981,560 | 1/1991 | Kajihara . |
| 4,997,516 | 3/1991 | Adler . |
| 4,997,722 | 3/1991 | Adler . |
| 5,289,630 | 3/1994 | Ferrier . |
| 5,395,651 | 3/1995 | Sodervall et al. .................. 427/437 X |
| 5,472,563 | 12/1995 | Kogawa et al. ...................... 427/98 X |
| 5,827,604 | 10/1998 | Uno et al. ........................... 427/437 X |
| 5,843,517 | 12/1998 | Ferrier et al. ............................. 427/98 |

FOREIGN PATENT DOCUMENTS

| | | |
|---|---|---|
| 9619097 | 6/1996 | WIPO . |
| WO 96/17503 | 6/1996 | WIPO . |

*Primary Examiner*—Michael W. Ball
*Assistant Examiner*—Barbara J. Musser
*Attorney, Agent, or Firm*—Carmody & Torrance LLP

[57] ABSTRACT

A process for improving the adhesion of a copper surface to a resinous layer, the process comprising contacting the copper layer with an adhesion promoting composition comprising a reducing agent and a metal selected from the group consisting of gold, silver, palladium, ruthenium, rhodium, zinc, nickel, cobalt, iron and alloys of the foregoing metals.

2 Claims, No Drawings

METHOD FOR THE MANUFACTURE OF PRINTED CIRCUIT BOARDS

BACKGROUND OF THE INVENTION

The present invention relates to printed circuits, and more particularly to a process for fabricating a multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,907,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (ie. the circuitry and the intermediate insulating layer), eliminates or minimizes pink ring and operates economically, all as compared to conventional processes.

SUMMARY OF THE INVENTION

The present invention comprises an improvement in the surface treatment of copper surfaces. It produces a strong and stable bond, resistant to chemical attack and to thermal and mechanical stresses between said copper surfaces and adjacent surfaces of resinous layers. It is especially useful in multilayer printed circuit fabrication and specifically in the treatment of the circuit elements prior to lamination.

The present invention comprises depositing a metal selected from the group consisting of gold, silver, palladium, ruthenium, rhodium, zinc, nickel, cobalt, iron and alloys of the foregoing metals onto the copper surfaces in an adherent manner prior to lamination. It is preferred that the copper surfaces be cleaned and microetched prior to the deposition of one of the foregoing metals.

A preferred aspect of this invention starts with a copper surface which has been oxidized with a standard oxidizing technique known in the art to produce an array of black or brown copper oxide whiskers or peaks on the copper surface such as the processes described in U.S. Pat. Nos. 4,409,037; 4,844,981; and 5,289,630. At least a portion of these peaks are then subjected to chemical reduction in a solution which comprises a chemical reducing agent and a metal selected from the group consisting of gold, silver, palladium, ruthenium, rhodium, zinc, nickel, cobalt, iron, and alloys of the foregoing metals. The copper surfaces (circuitry) are then laminated into multilayers according to known techniques.

DETAILED DESCRIPTION OF THE INVENTION

The present invention proposes an improved process for the surface treatment of copper surfaces prior to bonding such copper surfaces to resinous layers. The process is particularly useful in the fabrication of multilayer printed circuit boards. Copper surfaces which are treated according to the process of this invention produce improved bonds with resinous layers. Said improved bonds are stable, strong, and resistant to chemical attack and to the thermal and mechanical stresses which are generated in the subsequent fabrication steps and later use of the multilayer printed circuit boards.

The process comprises depositing a metal selected from the group consisting of gold, silver, palladium, ruthenium, rhodium, zinc, nickel, cobalt, iron and alloys of the foregoing metals onto the copper surfaces in an adherent manner prior to lamination. Preferred metals for deposition are nickel, palladium, ruthenium or gold. The most preferred metals for deposition are palladium and ruthenium and combinations thereof, or nickel followed by palladium. The inventors have found that when copper surfaces are plated with palladium and/or ruthenium in an adherent fashion prior to lamination, the bond produced is particularly strong and stable.

A preferred aspect of this invention starts with a copper surface which has been oxidized with standard oxidizing techniques known in the art to produce black or brown copper oxide whiskers or peaks on the copper surface. Then, according to a preferred aspect of the process proposed, at least a portion, and preferably all or substantially all of these peaks, are subjected to chemical reduction in a solution which comprises a chemical reducing agent and a metal selected from the group consisting of gold, silver, palladium, ruthenium, rhodium, zinc, nickel, cobalt, iron and alloys of the foregoing metals. Preferably the metal is nickel or palladium. The reducing agent should be such that it is capable of effectively reducing the copper oxide whiskers while depositing the metal contained in solution for deposition in an adherent fashion upon the reduced copper surface. Most preferably, the oxidized copper surface is subjected to chemical reduction in a solution which comprises a chemical reducing agent and nickel such that nickel is plated on the surface and then subsequently the foregoing nickel plated surface is further plated with palladium.

Thus a proposed process for preparing copper surfaces prior to lamination to a resinous layer would comprise:

1. cleaning the copper surfaces;
2. etching the copper surfaces in a controlled manner such that the surface topography of the copper is increased (ie. "microetching");

3. optionally, oxidizing the copper surface to produce whiskers or peaks of brown or black oxide;
4. optionally, chemically reducing the copper oxide surfaces;
5. depositing a metal selected from the group consisting of gold, silver, palladium, ruthenium, rhodium, zinc, nickel, cobalt, iron and alloys of the foregoing metals onto the surface in an adherent fashion; and
6. adhering the surface to a resinous layer.

In the preferred aspect of the invention steps 3 and 4 are performed, and steps 4 and 5 are combined and performed in one single treatment step.

An important part of the preferred aspect of the invention proposed is an adhesion promoting composition which comprises a reducing agent and a metal selected from the group consisting of gold, silver, palladium, ruthenium, rhodium, zinc, nickel, cobalt, iron, and alloys of the foregoing metals. The metal is preferably selected from the group consisting of nickel, palladium, ruthenium, and gold; and is most preferably selected from the group consisting of nickel and palladium. The adhesion promoting composition may comprise other ingredients or additives, such as acids, alkalies, chelators, stabilizers and the like, depending upon the particular metal and reducing agent. The concentration of the metal in the adhesion promoting solution may range from 0.08 to 20 grams per liter but is preferably from 0.1 to 10 grams per liter. The metal is preferably incorporated into the adhesion promoting composition in the form of a soluble salt or complex of the metal chosen.

The reducing agent must be capable of reducing the metal to be deposited in a controlled manner and depositing said metal on the surface in an adherent fashion. If the copper surface is oxidized prior to contact with the adhesion promoting composition as in the preferred aspect of this invention, then the reducing agent must also be such that it is capable of effectively chemically reducing the copper oxide layer. The inventors have found the following reducing agents suitable for use in the process of this invention: hypophosphite salts such as sodium and potassium hypophosphite, borohydride salts such as sodium borohydride, and aminoboranes such as dimethylaminoborane or diethylamine borane. The concentration of the reducing agent in the adhesion promoting composition may range from 0.5 to 50 grams per liter but is preferably from 2 to 30 grams per liter.

An example of an adhesion promoting composition useful in the process of this invention is as follows:

| Nickel Sulfate | 1.0 to 6.0 gr/l |
| dimethylaminoborane | 1 to 6 gr/l |
| Citric Acid | 1 to 25 gr/l |

The adhesion promoting composition may be applied to the surface by immersion, flood rinse, spray or similar means, however immersion is generally preferred. The temperature of the adhesion promoting composition may range from 80 to 200° F. and is dependent upon the composition itself and the method of application. The time of application may range from 0.5 to 10 minutes and is also dependent upon the particular adhesion promoting composition chosen and the method of application. The thickness of the metal deposited may range from 0.1 to 100 micro inches but is preferably from 1.0 to 50 micro inches and most preferably from 5 to 25 micro inches.

As noted, prior to applying the adhesion promoting composition, it is preferable that the copper surfaces be cleaned and microetched. It is also preferable that the copper surfaces be oxidized prior to application of the adhesion promoting composition. Cleaners useful in this process are typical soak cleaners used in the industry. One example is Omniclean CI, available from MacDermid, Incorporated of Waterbury, Connecticut. The microetchs useful in this process are also well known in the art. One exemplary microetch is MacuPrep G-4 which is also available from MacDermid, Incorporated. Finally processes and compositions for properly oxidizing the copper surfaces can be any standard techniques, well known in the art, which produce black or brown oxide conversion coatings on the copper. The inventors have successfully used OmniBond Oxide, available from MacDermid, Incorporated for this purpose.

The most preferred process of the proposed invention comprises:
1. clean the copper surfaces;
2. microetch the copper surfaces;
3. oxidize the copper surface to produce whiskers or peaks of brown or black oxide;
4. chemically reducing the copper oxide surfaces and depositing a metal selected from the group consisting of nickel and palladium upon the surfaces by contacting the surfaces with an adhesion promoting composition, said composition comprising a reducing agent and a metal selected from the group consisting of nickel and palladium; and
5. adhering the surface to a resinous layer.

The most preferred method of carrying out step 3 above is to oxidize the copper surface using standard techniques such as the Omnibond process sold by MacDermid, Incorporated of Waterbury, Conn. The oxidizing process is then followed by rinsing and contacting the oxide surface with an electroless nickel plating solution comprising nickel ions and a chemical reducing agent capable of reducing at least a portion of the oxided surface and plating nickel to a thickness of 5 to 50 microinches thereon. Finally, the nickel plated surface is rinsed and contacted with an electroless palladium plating solution in order to plate from 0.5 to 5, preferably 1–2 microinches of palladium upon the nickel plated surface.

The following examples should be considered as illustrative but not limiting in any way:

EXAMPLE I

A copper laminate panel and copper foil were processed according to the following preparatory cycle:

| MacDermid Omniclean CI, 165° F. | 5 min. |
| Rinse | 2 min. |
| MacDermid G-4 Microetch, 110° F. | 2 min. |
| Rinse | |

After the foregoing preparatory cycle the panel and foil were immersed in MacDermid D. F. Immersion palladium (the adhesion promoting composition) at 160° F. for 1 minute which deposited 3 micro inches of palladium metal onto the copper surfaces in an adherent fashion. The foil and panel had uniform light-gray metallic appearances.

The panel and foil were dried with forced air, baked at 150° C. for twenty minutes and laminated with NELCO tetrafunctional B stage (pre-preg) material at 325 psi and 380° F. After lamination the foil side was taped and stripped to provide foil strips one inch wide for peel strength determination. The panel was baked for two hours and 110° C. Portions of the panel were immersed in solder at 550° F. for ten and twenty seconds.

The following peel strengths were observed:

| Solder Immersion Time | Peel Strength |
|---|---|
| 0 sec. | 7.5 lb/in |
| 10 sec. | 7.25 lb/in |
| 20 sec. | 6.5 lb/in |

In addition the panel was drilled with 42 mil holes in an area not subjected to solder immersion and processed through a standard desmear and electroless plating throughhole process. The plated panels were sectioned, potted, polished horizontally and inspected for attack around the drilled holes ("pink ring").

Pink ring-0.0 mils.

EXAMPLE II

Example I was repeated with the exception that the adhesion promoting composition was MacDermid Planar Immersion Ruthenium which deposited 5 microinches of ruthenium at 170° F. after 5 minutes. The following peel strengths were observed:

| Solder Immersion Time | Peel Strength |
|---|---|
| 0 sec. | 10.0 lb/in. |
| 10 sec. | 9.5 lb/in. |
| 20 sec. | 8.5 lb/in. |

Pink ring-0.0 mils

EXAMPLE III

Example I was repeated except that the preparatory cycle was as follows:

| | |
|---|---|
| MacDermid Omniclean CI, 165° F. | 5 min. |
| Rinse | 2 min. |
| MacDermid G-4 Microetch, 110° F. | 2 min. |
| Rinse | |
| MacDermid Omnibond Predip, 130° F. | 1 min. |
| MacDermid Omnibond, 150° F. | 5 min. |
| Rinse | 2 min. |

A black oxide conversion coating was formed with the foregoing preparatory cycle and the panel and foil were then treated with MacDermid DF Immersion Palladium at 160° F. for 3 minutes as the adhesion promoting composition as in Example I. The following peel strengths were observed:

| Solder Immersion Time | Peel Strength |
|---|---|
| 0 sec. | 6.4 |
| 10 sec. | 5.8 |
| 20 sec. | 4.4 |

Pink ring-0.0 mils.

EXAMPLE IV

Example III was repeated except that the adhesion promoting composition was as follows:

| | |
|---|---|
| Nickel Sulfate | 6 gr/l |
| Dimethylamine Borane | 2 gr/l |
| Citric Acid | 20 gr/l |

The panel and foil were treated with the above noted adhesion promoting composition such that 5 microinches of nickel were deposited on the surfaces.

The following peel strengths were observed:

| Solder Immersion Time | Peel Strength |
|---|---|
| 0 sec. | 12.50 |
| 10 sec. | 12.25 |
| 20 sec. | 11.00 |

Pink ring-0.0 mils

EXAMPLE V

Example II was repeated except that only 2 microinches of ruthenium was deposited and 3 microinches of palladium was deposited upon the ruthenium plated surface.

| Solder Immersion Time | Peel Strength |
|---|---|
| 0 sec. | 11.0 lb/in |
| 10 sec. | 11.0 lb/in |
| 20 sec. | 10.25 lb/in |

Pink ring-0.0 mils.

EXAMPLE VI

Example I was repeated except that the preparatory cycle was as follows:

| | |
|---|---|
| MacDermid Omniclean CI, 165° F. | 5 min. |
| Rinse | 2 min. |
| MacDermid G-4 Microetch, 110° F. | 2 min. |
| Rinse | 2 min. |
| MacDermid Omnibond Predip, 130° F. | 1 min. |
| MacDermid Omnibond, 150° F. | 5 min. |
| Rinse | 2 min. |

A black oxide conversion coating was formed with the foregoing preparatory cycle and the panel and foil were then treated with the following composition such that approximately 10 microinches of nickel were plated on the surfaces:

| | |
|---|---|
| Nickel Sulfate | 6 gr/l |
| Dimethylamine Borane | 2 gr/l |
| Citric Acid | 20 gr/l |

The panel and foil were then rinsed and further treated with MacDermid DF Immersion Palladium at 160° F. for 3 minutes such that approximately 2 microinches of palladium were plated on the surfaces.

| Solder Immersion Time | Peel Strength |
| --- | --- |
| 0 sec. | 12.5 lb/in |
| 10 sec. | 12.5 lb/in |
| 20 sec. | 11.75 lb/in. |

Pink ring-0.0 mils.

COMPARATIVE EXAMPLE

A panel and foil were processed through MacDermid's Omni Bond Oxide System according to the following cycle:

| | |
| --- | --- |
| MacDermid Omniclean CI, 165° F. | 5 min. |
| Rinse | 2 min. |
| MacDermid G-4 Microetch, 110° F. | 2 min. |
| Rinse | |
| MacDermid Omnibond Predip, 130° F. | 1 min. |
| MacDermid Omnibond, 150° F. | 5 min. |
| Rinse | 2 min. |

A uniform dark black, adherent coating was formed. The panel and foil were laminated and tested as in Example 1. The following results were achieved.

| Solder Immersion Time | Peel Strength |
| --- | --- |
| 0 Sec. | 8.0 lb/in. |
| 10 Sec. | 6.0 lb/in. |
| 20 Sec. | 6.0 lb/in. |

We claim:

1. A process for improving the adhesion of a copper surface to a resinous layer, said process comprising:

a. contacting said copper surface directly with an adhesion promoting composition comprising a reducing agent and a metal selected from the group consisting of, palladium, and ruthenium, such that the adhesion promoting composition plates a layer of the metal selected from the group consisting of palladium and ruthenium directly upon the copper surface thereby creating a metal plated layer upon the copper surface; and thereafter b. adhering said metal plated layer directly to said resinous layer;

wherein said process occurs without the chemical function of a copper oxide conversion coating on the copper surface prior to contacting said copper surface with the adhesion promoting composition.

2. A process according to claim 1 wherein 0.5 to 100 microinches of metal are deposited on the copper surface.

* * * * *

UNITED STATES PATENT AND TRADEMARK OFFICE
CERTIFICATE OF CORRECTION

PATENT NO : 6,120,639
DATED : September 19, 2000
INVENTOR(S): Ronald Redline, Lucia Justice and Lev Taytsas It is certified that error appears in the above-identified patent and that said Letters Patent are hereby corrected as shown below:

Claim 1, lines 25-26, delete the word "function" and insert the word --formation--.

Signed and Sealed this

Tenth Day of April, 2001

Attest:

NICHOLAS P. GODICI

Attesting Officer

Acting Director of the United States Patent and Trademark Office